United States Patent [19]
Pomerantz

[11] 4,153,872
[45] May 8, 1979

[54] CREST FIRING MEANS

[75] Inventor: Daniel I. Pomerantz, Lexington, Mass.

[73] Assignee: P. R. Mallory & Co. Inc., Indianapolis, Ind.

[21] Appl. No.: 807,010

[22] Filed: Jun. 16, 1977

[51] Int. Cl.² ............................................. G05F 3/04
[52] U.S. Cl. .............................. 323/21; 307/252 N; 323/24
[58] Field of Search ...................... 307/252 B, 252 N; 323/19, 21, 24, 34, 36, 38, 39; 363/57

[56] References Cited
U.S. PATENT DOCUMENTS

| | | | |
|---|---|---|---|
| 3,524,986 | 8/1970 | Harnden | 323/21 UX |
| 3,524,997 | 8/1970 | Harnden et al. | 323/21 X |
| 3,548,290 | 12/1970 | Swinehart | 323/21 X |
| 3,925,709 | 12/1975 | Mitchell et al. | 323/21 X |

OTHER PUBLICATIONS

Sheng, "Inrush Current Reduction in Triac Switched Inductive Loads," RCA Technical Note No. 1134, Nov. 13, 1975, sheets 1-3.

*Primary Examiner*—A. D. Pellinen
*Attorney, Agent, or Firm*—Hoffmann, Meyer & Coles

[57] ABSTRACT

Power is applied to an AC load at the crest of a voltage waveform by employing a light emitting diode. The crest firing circuit further includes a detector responsive to the diode's light emitting properties which fires a semiconductor switching device thereby activating the AC load.

16 Claims, 4 Drawing Figures

CREST FIRING MEANS

BACKGROUND OF THE INVENTION

1. Field of the Invention

The present invention relates to means for applying power to an AC load and is more particularly concerned with the application of power at the crest of an oscillating voltage waveform to thereby prevent current surges during activation of the AC load.

2. Description of the Prior Art

With certain types of AC loads and particularly with those requiring a substantial amount of power for initial activation such as the primary winding of a transformer used to drive a magnetron power supply in a microwave oven, a means must be employed to limit current surges during start-up; otherwise, fuses and circuit breakers used to prevent excessive current flow would be continuously thrown open as a result of excessive current being drawn by the load or in the absence of a fuse, circuit breaker, or other means for preventing excessive current flow, wiring and/or the AC load itself may be damaged. Current surges are produced by activation of the AC load at random phases of the alternating reference signal. One method of preventing such surges is by activation of the load at the crest or peak voltage of the alternating signal. Typically, rather than attempt to have the load activate or draw power for activation at the crest of an alternating reference signal, a current limiting device such as a resistance means will be electrically coupled in series with the load to prevent current surges. Accordingly, the larger the value of the resistance means the less current required to provide the necessary power to activate the load.

The present invention provides a means for applying power to an AC load at the voltage crest of an alternating reference signal thereby alleviating the necessity for a current limiting device to prevent current surges during the activation of the load. Employed in the present invention is a light emitting diode which fires or turns-on a semi-conductor switching device at the crest of an oscillating voltage waveform thereby activating the AC load. The invention utilizes two important light emitting properties of light emitting diodes when driven by a voltage source to achieve the objects enumerated hereinafter. These important properties are (1) that the light emitted by the light emitting diode is proportional in intensity to the instantaneous current flowing through the light emitting diode when biased in a forward direction and (2) that the current flowing through the light emitting diode depends exponentially on the applied voltage in a manner characteristic of junction diodes in general; namely, very little current flows through the light emitting diode when the applied voltage is below an established threshold voltage and once the applied voltage has reached the threshold voltage the current and therefore luminous intensity increases very rapidly (i.e. exponentially) as the applied voltage continues to increase.

SUMMARY OF THE INVENTION

In accordance with the present invention in its broadest concept, there is provided a means and method for applying power to an AC load at the crest of an oscillating voltage waveform in order to prevent current surges during activation of the load.

It is therefore an object of the present invention to provide a crest firing means for applying power to an AC load at the crest of an oscillating voltage waveform.

It is a further object of the present invention to employ a light emitting diode in a crest firing means for activating an AC load at the crest of an oscillating voltage waveform.

It is yet another object of the present invention to provide a crest firing means which utilizes the light emitting properties of a light emitting diode to actuate a detection means whereby power is applied to an AC load at the crest of an oscillating voltage waveform.

Still another object of the present invention is to provide a crest firing means for applying power to an AC load which includes a light emitting diode responsive to an alternating reference signal, detection means responsive to the light emitting diode, triggering means electrically coupled to the detection means, expositional means for manifesting the luminous properties of the light emitting diode, and a semiconductor switching device responsive to the triggering means for activating the AC load.

Still yet another object of the present invention is to provide a method for activating an AC load at the voltage crest of an alternating reference signal which includes the steps of applying the alternating reference signal to a light emitting diode, manifesting a light pulse of a luminous intensity proportionate to the instantaneous current flow of the alternating reference signal through the light emitting diode, detecting the light pulse, and triggering an activating means whereby the AC load is activated at the voltage crest of the alternating reference signal.

Other objects and advantages of the present invention will be apparent from the following detailed description of a preferred embodiment thereof, which description should be considered in conjunction with the accompanying drawing in which:

DESCRIPTION OF THE PREFERRED EMBODIMENT

Figure 1:
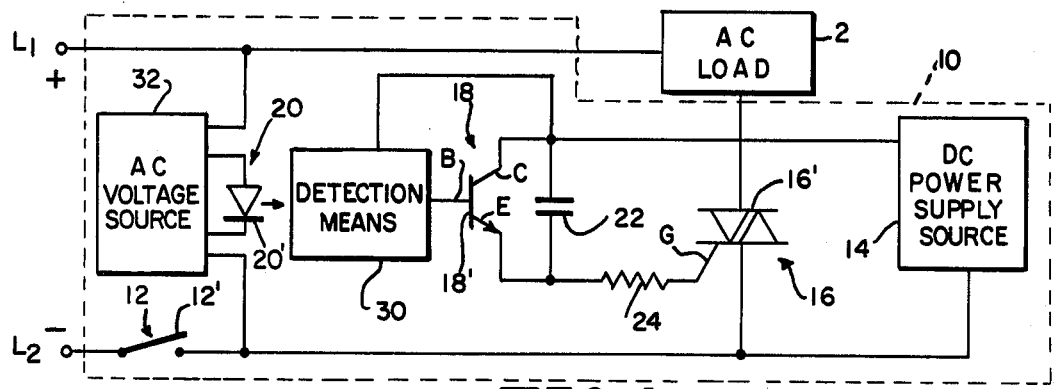
FIG. 1 is a schematic wiring diagram of a first embodiment of the crest firing means of the present invention.

A first embodiment of a crest firing means 10 in accordance with the present invention for applying power to an AC load 2 at the crest of an oscillating voltage waveform of an alternating reference signal applied at lines L1 and L2 is illustrated in FIG. 1. The crest firing means 10 includes a light emitting device 20 responsive to the alternating reference signal applied at lines L1 and L2, AC voltage source 32 interconnected between the alternating reference signal and the light emitting device 20, expositional means 12 for manifesting the luminous properties of light emitting device 20, detection means 30 responsive to the luminous properties of the light emitting device 20, triggering means 18 electrically coupled to the detection means 30, activating means 16 responsive to triggering means 18 for activating AC load 2, and a DC power supply source 14.

Figure 2:
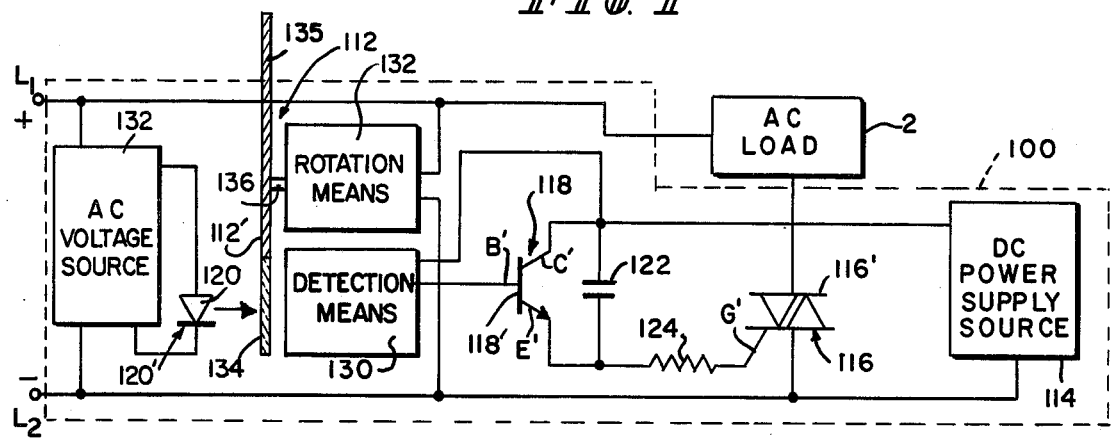
FIG. 2 is a schematic wiring diagram of a second embodiment of the crest firing means of the present invention.

A second embodiment of a crest firing means 100 in accordance with the present invention for applying power to an AC load 2 at the crest of an oscillating voltage waveform of an alternating reference signal applied at lines L1 and L2 is illustrated in FIG. 2. The crest firing means 100 includes a light emitting device 120 responsive to the alternating reference signal applied at lines L1 and L2, AC voltage source 132 interconnected between the alternating reference signal and the light emitting device 120, expositional means 112 for manifesting the luminous properties of light emitting device 120, detection means 130 responsive to the luminous properties of the light emitting device 120, triggering means 118 electrically coupled to the detection means 130, activating means 116 responsive to triggering means 118 for activating AC load 2, and a DC power supply source 114.

Referring now to FIGS. 1 and 2 light emitting devices 20 and 120 are each light emitting diodes 20' and 120' which are electrically coupled through AC voltage sources 32 and 132 respectively to lines L1 and L2 such that they are biased in a forward direction. AC voltage sources 32 and 132 may be any means to assure that the voltage driving light emitting diodes 20' and 120' is in phase with the alternating reference signal; such as a step down transformer. When driven by a voltage source 32 or 132, i.e. an alternating reference signal applied at lines L1 and L2, the light emitting diode 20' or 120' exhibits at least two important luminous properties which are utilized in the present invention. These luminous properties are (1) that the light emitted by the light emitting diode is substantially linearly proportional in intensity to the instantaneous current flowing through the light emitting diode when it is biased in a forward direction and (2) as graphically illustrated in FIG. 3, that the current X flowing through the light emitting diode depends exponentially on the applied voltage N in a manner characteristic of junction diodes in general; namely, very little current flows through the light emitting diode when the applied voltage is below an established threshold voltage Y and once the applied voltage has reached the threshold voltage Y the current and therefore luminous intensity of the light emitting diode increases very rapidly (i.e. exponentially) as the applied voltage continues to increase.

Continuing to refer to FIGS. 1 and 2, detection means 30 and 130 may include any means capable of detecting a light pulse emitted by light emitting diode 20' or 120' and implementing the pulse as an electrical signal. For example detection means 30 and 130 may be any conventional photodetector. Detection means 30 and 130 are each electrically coupled to triggering means 18 and 118 respectively. Triggering means 18 and 118 each are bipolar semiconductor switching devices 18' and 118', preferably NPN transistors, having their bases B and B' electrically coupled to detection means 30 and 130 respectively, their collectors C and C' electrically coupled to the power supply sources 14 and 114 respectively and to a first side of capacitance means 22 and 122 respectively, and their emitters E and E' electrically coupled to a second side of capacitance means 22 and 122 respectively and a first side of resistance means 24 and 124 respectively. It will be understood by those skilled in the art that by utilizing photo transistors, detection means 30 and 130 and bipolar semiconductor switching devices 18' and 118' may be replaced by a single photo transistor in each embodiment of crest firing means 10 and 100 which will serve both as a detection means and a triggering means combined.

Activating means 16 and 116 illustrated in FIGS. 1 and 2 respectively are bidirectional semiconductor switching devices 16' and 116', preferably triacs. Each bidirectional semiconductor switching device 16' and 116' has a gate G and G' respectively electrically coupled to a second side of resistance means 24 and 124 respectively. Furthermore, each bidirectional semiconductor switching device 16' and 116' is electrically coupled to the AC load 2.

DC power supply source 14 and 114 illustrated in FIGS. 1 and 2 respectively may include any conventional circuitry for filtering and rectifying the alternating reference signal applied at lines L1 and L2.

Referring now to FIG. 1, expositional means 12 for manifesting the previously described luminous properties of light emitting diode 20' includes a switching means 12' inserted in line L2 between the alternating reference signal and the light emitting diode 20' for electrically coupling the signal to the diode 20'. Switching means 12' may include any conventional switching device which will cause the transmission of the alternating reference signal when closed thereby turning-on light emitting diode 20' and will interrupt transmission of the alternating reference signal when open thereby turning-off light emitting diode 20'.

Referring now to FIG. 2, expositional means 112 for manifesting the previous described luminous properties of the light emitting diode 120' includes movable masking means 112' which may be a disc having opaque and transparent areas 135 and 134 respectively to thereby expose a light pulse emitted by light emitting abode 120' to detection means 130 when a transparent area is moved therebetween. Movable masking means 112' may be mounted on a shaft 136 coupled to a rotation means 132 which as illustrated may be any conventional AC drive motor. Accordingly, as movable masking means 112' is rotated by rotation means 132 a transparent area 134 will allow the light pulse emitted by light emitting diode 120' to be detected by detection means 130.

Figure 3:
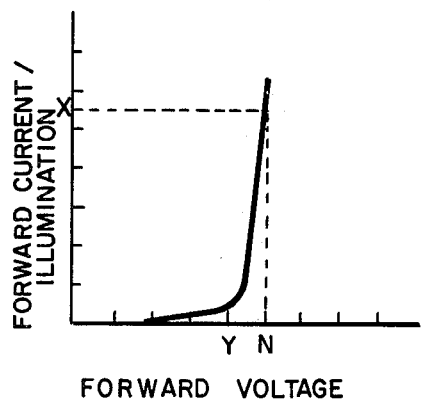
FIG. 3 is a graphic representation of the voltage vs. current (luminous intensity) characteristics of a typical light emitting diode.
Figure 4:
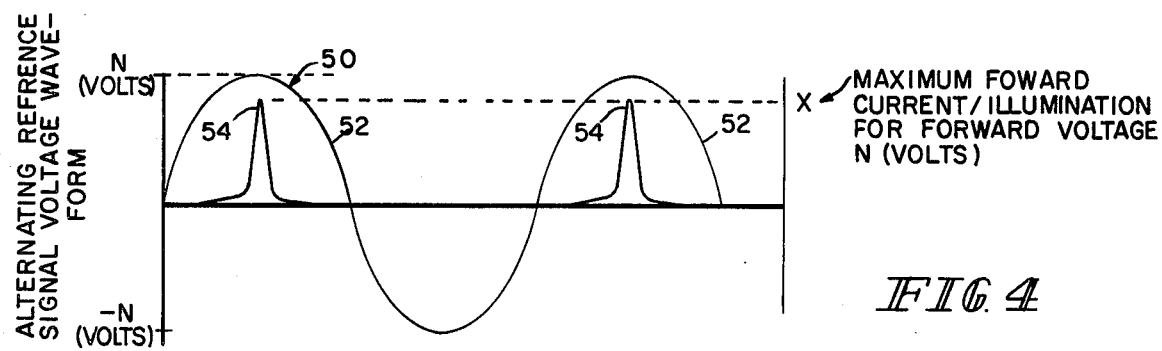
FIG. 4 is a graphic representation of the operation of the crest firing means of the present invention

Since the embodiments of crest firing means 10 and 100 shown in FIGS. 1 and 2 operate substantially the same, the operation of crest firing means 10 only will be described. Accordingly, referring now to FIGS. 1, 3, and 4 an oscillating voltage waveform 50 of an alternating reference signal applied at lines L1 and L2 and appearing at the outputs of AC voltage sources 32 and 132 shown in FIG. 4 having a voltage crest N which is greater than the threshold voltage Y of light emitting diode 20' shown in FIG. 3 is applied to light emitting diode 20' by closing switching means 12'. As the voltage of voltage waveform 50 increases from 0 volts to its crest voltage of N volts through light emitting diode 20', the current and therefore the luminous intensity of light emitting diode 20' will increase exponentially to X as illustrated in FIG. 4 at which point light emitting diode 20' emits a light pulse 54. As the voltage of voltage waveform 50 decreases from its voltage crest of N volts, the luminous intensity of light emitting diode 20' will decrease exponentially to 0 as illustrated in FIG. 4. As shown in FIG. 4 at each voltage crest of N volts of the positive sinusoidal voltage waves 52 of voltage waveform 50, light emitting diode 20' will emit a light pulse 54.

Each light pulse 54 emitted by light emitting diode 20' is detected by detection means 30 and thereby implemented through the base B of triggering means 18 to turn-on triggering means 18 and thereby allow a DC signal supplied by DC power supply source 14 to be emitted from its emitter E. Triggering means 18 in conjunction with resistance means 24 provide a sufficient DC current at the gate G of activating means 16 to cause activating means 16 to fire and thereby activate load 2 at the voltage crest (N volts) of waveform 50. Capacitance means 22 and resistance means 24 form a resistance-capacitance timing network to maintain current flowing to the gate G of activating means 16 during the period between light pulses as shown in FIG. 4 so that the operation of AC load 2 is not interrupted. Accordingly, the values of capacitance means 22 and resistance means 24 should be such that the time constant of the resistance-capacitance timing network is greater than 1/60 of a second.

The embodiment of crest firing means 100 illustrated in FIG. 2 operates as described above but utilizes a means for manifesting the luminous properties of light emitting diode 120' which includes a movable masking means 112' as previously described.

It will be apparent to those skilled in the art of means for activating AC loads that various changes in the specific embodiments illustrated and apparently modified embodiments of the present invention may be made without departing from its scope. Accordingly, it is intended that all material contained in the preceding description or shown on the accompanying drawings be interpreted as illustrative only and not in a limiting sense.

What I claim is:

1. A crest firing means for applying power to a load at a voltage crest of an alternating reference signal comprising: a light emitting device having a threshold point at which it emits a light pulse indicative of said voltage crest of said alternating reference signal, detection means responsive to said light pulse emitted by said light emitting device, and activating means responsive to said detection means for activating said load at said voltage crest of said alternating reference signal.

2. The crest firing means as recited in claim 1 wherein said light emitting device has a luminous intensity which increases exponentially as said voltage of said alternating reference signal increases.

3. The crest firing means as recited in claim 2 wherein said light emitting device is a light emitting diode.

4. The crest firing means as recited in claim 3 further including a triggering means electrically coupled to said detection means for triggering said activating means at said voltage crest of said alternating reference signal.

5. The crest firing means as recited in claim 4 wherein said triggering means is a bipolar semiconductor switching device and said activating means is a bidirectional semiconductor switching device.

6. The crest firing means as recited in claim 5 further including expositional means for manifesting said light pulse emitted by said light emitting diode whereby said light pulse is detected by said detection means.

7. The crest firing means as recited in claim 6 wherein said expositional means includes switching means for electrically coupling said alternating reference signal to said light emitting diode.

8. The crest firing means as recited in claim 6 wherein said expositional means includes movable masking means for exposing said light pulse to said detection means.

9. A method for activating a load at a voltage crest of an alternating reference signal comprising the steps of: applying said alternating reference signal to a light emitting device, manifesting a light pulse emitted at a threshold voltage which is substantially equivalent to said voltage crest of said alternating reference signal, detecting said light pulse, and triggering an activating means whereby said load is activated at said voltage crest of said alternating reference signal.

10. The method as recited in claim 9 wherein said light pulse has a luminous intensity which increases substantially linearly as instantaneous current flow increases through said light emitting device.

11. The method as recited in claim 10 wherein said light emitting device is a light emitting diode.

12. The method as recited in claim 11 wherein said activating means includes a bidirectional semiconductor switching device which is triggered by a bipolar semiconductor switching device.

13. The method as recited in claim 9 wherein said alternating reference signal is applied to said light emitting device by switching means electrically coupled therebetween.

14. The method as recited in claim 9 wherein said light pulse is manifested by movable masking means which when moved exposes said light pulse to a detection means whereby said light pulse is detected.

15. A crest firing means for applying power to a load at a voltage crest of an alternating reference signal comprising: a light emitting device having a luminous intensity which increases exponentially as said voltage of said alternating reference signal increases whereby a light pulse is emitted at said voltage crest, detection means responsive to said light pulse emitted by said light emitting device, and activating means responsive to said detection means for activating said load at said voltage crest of said alternating reference signal.

16. A method for activating a load at a voltage crest of an alternating reference signal comprising the steps of: applying said alternating reference signal to a light emitting device, manifesting a light pulse of luminous intensity which increases exponentially as said voltage of said alternating reference signal increases having a peak intensity at said voltage crest, detecting said light pulse, and triggering an activating means whereby said load is activated at said voltage crest of said alternating reference signal.

* * * * *